(12) United States Patent
Kao et al.

(10) Patent No.: US 6,176,198 B1
(45) Date of Patent: Jan. 23, 2001

(54) APPARATUS AND METHOD FOR DEPOSITING LOW K DIELECTRIC MATERIALS

(75) Inventors: Yeh-Jen Kao, San Jose; Fong M. Chang, Los Gatos; Robert B. Majewski, Scotts Valley; John Parks, Richmond; David Wanamaker, San Jose; Yen-Kun Wang, Fremont, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/184,934

(22) Filed: Nov. 2, 1998

(51) Int. Cl.⁷ .................................................. C23C 16/00
(52) U.S. Cl. ..................................................... 118/723 ME
(58) Field of Search ................... 118/723 MW, 118/723 ME, 723 E, 723 ER, 723.1, 723.1 R, 715, 728

(56) References Cited

U.S. PATENT DOCUMENTS

| | | | |
|---|---|---|---|
| 5,750,436 | * | 5/1998 | Fong et al. ..................... 118/723 ME |
| 5,755,886 | * | 5/1998 | Wang et al. ......................... 118/715 |
| 5,902,404 | * | 5/1999 | Fong et al. ..................... 118/723 ME |
| 5,919,332 | * | 7/1999 | Koshiiishi et al. .................. 156/345 |

OTHER PUBLICATIONS

U.S. Patent application Entitled "Plasma Processes for Depositing Low Dielectric Constant Films," filed Nov. 4, 1998, Ser. No. 09/185,555.
U.S. Patent application Entitled "CVD Plasma Assisted Low Dielectric Constant Films," filed Sep. 29, 1998, Ser. No. 09/162,915.
U.S. Patent application Entitled "Low Power Method of Depositing A Low K. Dielectric with Organo Silane," filed, 1998, Ser. No. 09/114,682.
U.S. Patent application Entitled Method of Depositing A Low K Dielectric with Organo Silane, filed Feb. 11, 1998, Ser. No. 09/021,788.

* cited by examiner

Primary Examiner—Richard Bueker
Assistant Examiner—Erin Fieler
(74) Attorney, Agent, or Firm—Thomason, Moser & Patterson

(57) ABSTRACT

The invention provides a deposition system and methods of depositing materials onto substrates. In one aspect, a modular processing chamber is provided which includes a chamber body defining a processing region. The chamber body includes a removable gas feedthrough, an electrical feedthrough, a gas distribution assembly mounted on a chamber lid and a microwave applicator for generating reactive gases remote from the processing region.

18 Claims, 4 Drawing Sheets

APPARATUS AND METHOD FOR DEPOSITING LOW K DIELECTRIC MATERIALS

BACKGROUND OF THE INVENTION

1. Field of the Invention

The present invention relates to a processing system and more particularly to a chemical vapor deposition chamber useful for depositing dielectric materials on substrates during the fabrication of integrated circuits and other electronic devices.

2. Background of the Related Art

In the fabrication of integrated circuits and other electronic devices on substrates, multiple deposition and etch steps are performed in sequence to fabricate the desired electronic structures or devices. The trend has been to reduce the overall size of the features which make up the devices and to increase the density of devices formed on a single die. The goal in designing and fabricating these electronic devices is to achieve an overall increase in the speed and capacity of the overall device. This trend has caused a significant amount of research to be undertaken in the area of materials to accomplish these goals. As dimensions decrease, a need arises for materials with lower dielectric constants to act as insulators and less resistive materials to serve as conductors.

One area of research has been conducted in the area of dielectric materials which have a lower dielectric constant. These materials are useful in preventing interference and cross talk between adjacent metal layers, lines and other conducting features. As the trend continues, the goal is to reduce the overall thickness of the dielectric material disposed between conducting features with improved insulating properties. Examples of promising materials include porous oxides having at least some carbon content and insulative polymers or copolymers.

As new materials are investigated, new hardware is needed to perform the deposition steps on substrates. In addition, with the research continually developing, the hardware needs to be adaptable to accommodate a change in precursor gases as well as process conditions. Typically, processing hardware has been designed to accommodate a certain process and a change in process conditions required a change in hardware. For example, a chamber designed for the deposition of silicon dioxide, the traditional dielectric material used in semiconductor fabrication, has been configured to operate in the process regime required to deposit this material. A change in precursor materials or resultant film composition required a change in processing equipment as well as a change in the accompanying software. These required changes are costly and do not provide flexibility in integrating new processes.

Therefore, there is a need for a process system which can deposit new materials and which is adaptable to a change in process gas precursors and/or process conditions.

SUMMARY OF THE INVENTION

The present invention provides a method and apparatus for depositing material using chemical vapor deposition. In one aspect of the invention, a processing apparatus is provided which comprises a chamber body defining a processing region. A removable gas feedthrough is mounted on the chamber body to deliver process gases from below the chamber to a gas distribution assembly disposed on a lid of the chamber body. A microwave applicator is preferably mounted on the chamber body to deliver excited gases into the processing region of the chamber body. Cleaning gases as well as process gases, such as oxidizing process gases can be delivered to the processing region via the microwave applicator and the gas distribution assembly. Additionally, an exhaust port is preferably mounted vacuum pump mounted on a side of the chamber body.

DETAILED DESCRIPTION OF A PREFERRED EMBODIMENT

Figure 1:
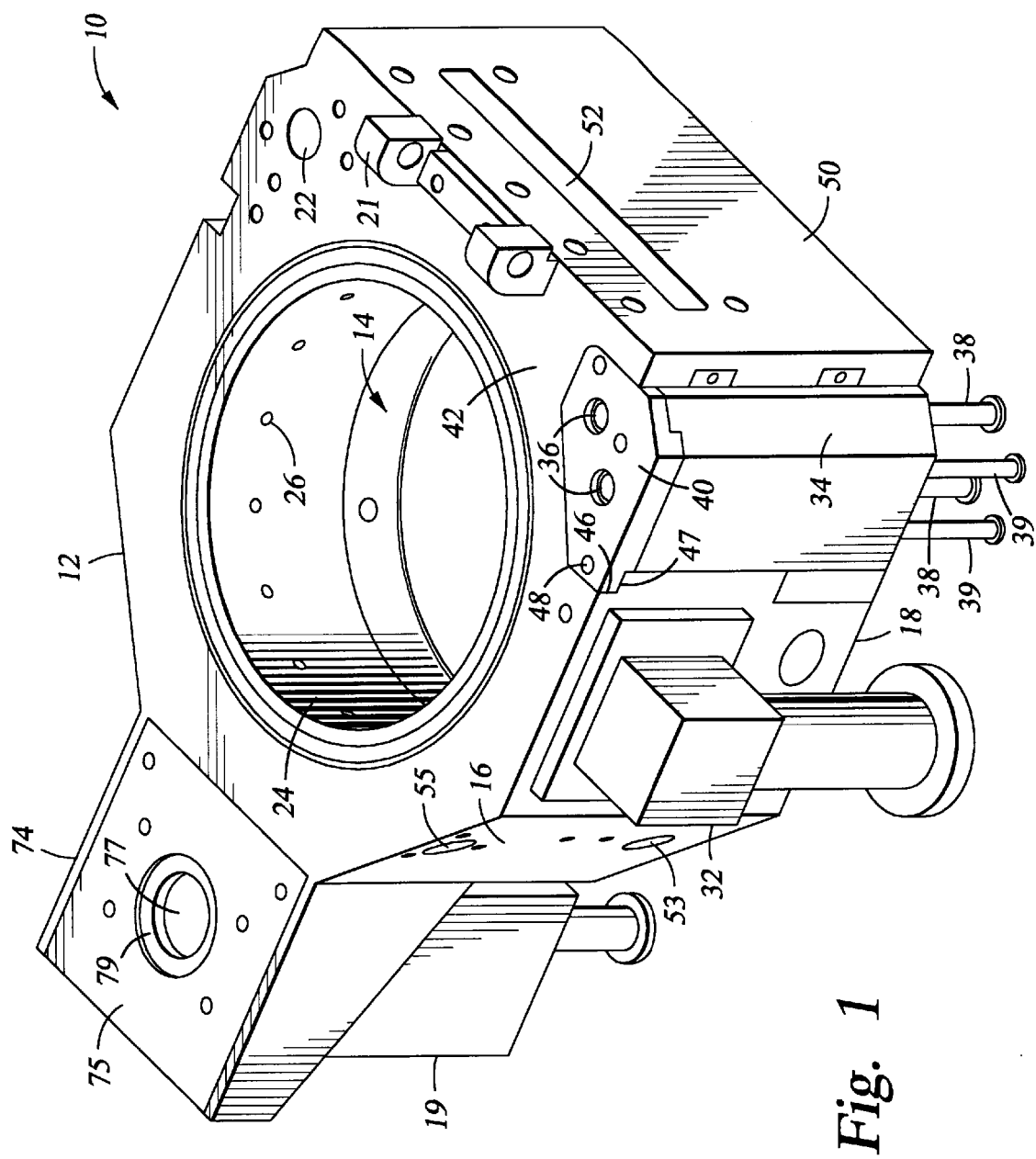
FIG. 1 is a substantially top perspective view of a processing chamber of the invention.

FIG. 1 is a substantially top perspective view showing one embodiment of a chamber 10 of the present invention. Generally, the chamber 10 includes a chamber body 12 defining a central processing region 14. The chamber body includes a sidewall 16 and a bottom 18 which is preferably made of stainless steel or aluminum. In the embodiment shown, the processing region is a cylindrical region defined in the chamber body. However, the processing region can be configured in other shapes and sizes to accommodate the shape and size of the substrate being processed. A nose 74 of the chamber preferable supports a microwave applicator 19 wherein cleaning gases and other process gases can be excited using microwave energy and delivered into the gas distribution system. A lid (shown in FIG. 2) is hingedly mounted on the upper portion of the process chamber at hinge 21 and includes the gas distribution assembly (also shown in FIG. 2) disposed thereon.

The chamber body 12 defines an electrical feedthrough 22 through which power, such as RF power, can be delivered into the processing region to strike plasma therein. The power is delivered through the feedthrough to a gas distribution assembly which is mounted on the chamber lid and which will be described below in reference to FIG. 2. The chamber body 12 may also include fluid channels (not shown) formed in the sidewall and disposed about the processing region to allow temperature control of the chamber adjacent the processing region.

A chamber liner 24 is disposed in the processing region and defines the inner boundaries of the processing region 14 when positioned in the chamber. The liner 24 is preferably made of a dielectric material such as quartz or a ceramic and defines a plurality of pumping holes 26. The chamber body defines an annular channel 28 (shown in FIG. 3) around the perimeter of the processing region which in combination with the liner 24 and Teflon insert 30 form an annular manifold 31 into which the gases can be uniformly exhausted through the pumping holes 26. A detachable exhaust port 32 is mounted on the side of the chamber body and is connected to the manifold 31 to provide a low pressure condition, or other pressure condition, in the chamber as desired.

A removable gas feedthrough 34 is mounted to the chamber body 12 to provide process gases to the gas distribution assembly. The gas feedthrough includes one or more gas channels 36 formed therein and adapted to deliver select gases to the gas distribution system from below the chamber. The removable gas feedthrough 34 is preferably made of stainless steel, however, other suitable materials may be used as well. The lower portion of the gas feedthrough includes gas fittings 38 which can be easily connected or disassembled to enable easy changes in process gases as well as gas feedthroughs. The upper surface 40 of the gas feedthrough is preferably flush with the upper surface 42 of the chamber body to form a sealing surface for the chamber lid 54. An o-ring seal is preferably disposed around the outlets of the gas channels to form a seal with the chamber lid. The gas feedthrough can be equipped with fluid channels and inlets 39, resistive heating elements or other heating/cooling elements to maintain the gases flown through the gas feedthrough at a desired temperature. The fluid channels may be in communication with a heating/cooling system of the gas distribution system disposed on the lid and may therefore serve as the inlet and outlet of the fluid source.

The gas feedthrough 34 includes an upper flange 46 which rests on a shoulder 47 formed in the chamber body at the upper portion of a recess in the chamber body into which the gas feedthrough is mounted. The gas feedthrough is removably secured to the chamber body by screws 48 disposed in the upper flange 46.

A mounting surface 50 is provided on the back of the chamber to enable the chamber to be mounted to a transfer chamber or other substrate delivery or transfer system. A slit opening 52 is preferably provided in the mounting surface to enable passage of substrates between the process chamber and the transfer chamber.

A pressure sensing device such as a Baratron or other device well known in the industry can be disposed at least partially into the chamber through port 53. The pressure sensing device is connected to a controller, as are the other components of the system, to enable control over process conditions in the chamber. Additionally, the chamber includes a window 55, such as a quartz window, to enable visual inspection into the chamber. Both the pressure sensors and the visual inspection window are typically found in the industry.

Figure 2:
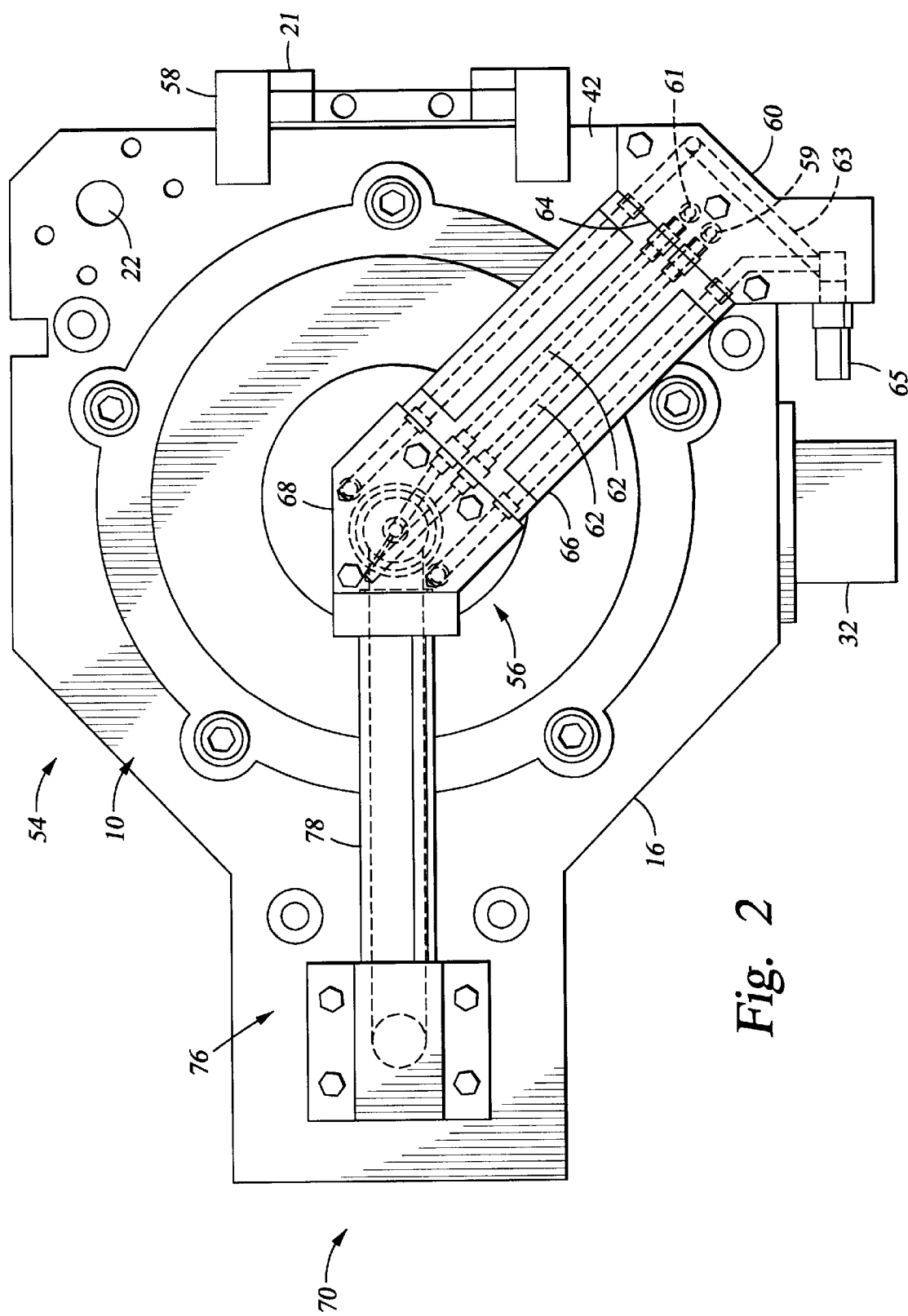
FIG. 2 is a top perspective view of a chamber lid of the present invention.

FIG. 2 is a top perspective view of the chamber lid 54 and the gas distribution assembly 56 mounted thereon. The chamber lid 54 is hingedly mounted to the chamber body hinge 21 via mounting bracket 58. Gas shocks or other lift assisting device can be mounted between the chamber body and the lid to facilitate opening and closing of the chamber lid. A process gas inlet manifold 60 is disposed on the lid and is adapted to receive process gases through the process gas feedthrough 34 mounted on the chamber body. The process gas inlet manifold defines one or more channels 59, 61 therein which align with the channels 36 in the gas feedthrough. A gas outlet side 64 of the inlet manifold is connected to a constant voltage gradient feedthrough 66. The channels 59, 61 further align with channels 62 in the constant voltage gradient feedthrough 66. A gas outlet manifold 68 is disposed centrally on the chamber lid 54 and delivers (or outputs) the process gases and/or cleaning gases from either the constant voltage gradient feedthrough 66, disposed between the gas inlet manifold and gas outlet manifold, or a remote gas excitation and delivery system 70. Cooling/heating channel 63 forms a loop through the gas inlet manifold 60, constant voltage gradient feedthrough 66 and the gas outlet manifold 68 to provide heating/cooling to this gas delivery assembly. As described above, the inlet to the cooling/heating channels may be through the gas feedthrough 34 or alternatively can be directly into the gas inlet manifold via connection 65.

The remote excitation system includes a microwave applicator 19 disposed below the chamber lid on the chamber body nose 74. The nose includes a mounting plate 75 which mounts the microwave applicator below the plate and connects the gas delivery system to the upper surface thereof. A conventional microwave applicator such as one commercially available from Astex Corporation. A port 77 is disposed through the plate 75 to enable fluid communication from the microwave applicator 19 disposed below the plate to the gas distribution assembly 70 disposed above the plate. O-ring seals 79 disposed around the port on both sides of the plate provide a sealed passage for gases to be delivered into the gas distribution assembly and into the chamber. A gas delivery system 76 delivers the excited gases from the microwave applicator into the outlet manifold 68. A gas delivery tube 78, preferably made of Teflon, is disposed between the microwave applicator and the outlet manifold to deliver excited gases from the microwave applicator into the gas outlet manifold and into the gas distribution system. The remote excitation system can be used to deliver excited cleaning gases into the chamber during cleaning cycles. Additionally, $N_2O$ and other oxidizing gases can be excited in the remote system and separately delivered into the chamber for reaction with the silicon source gases.

Figure 3:
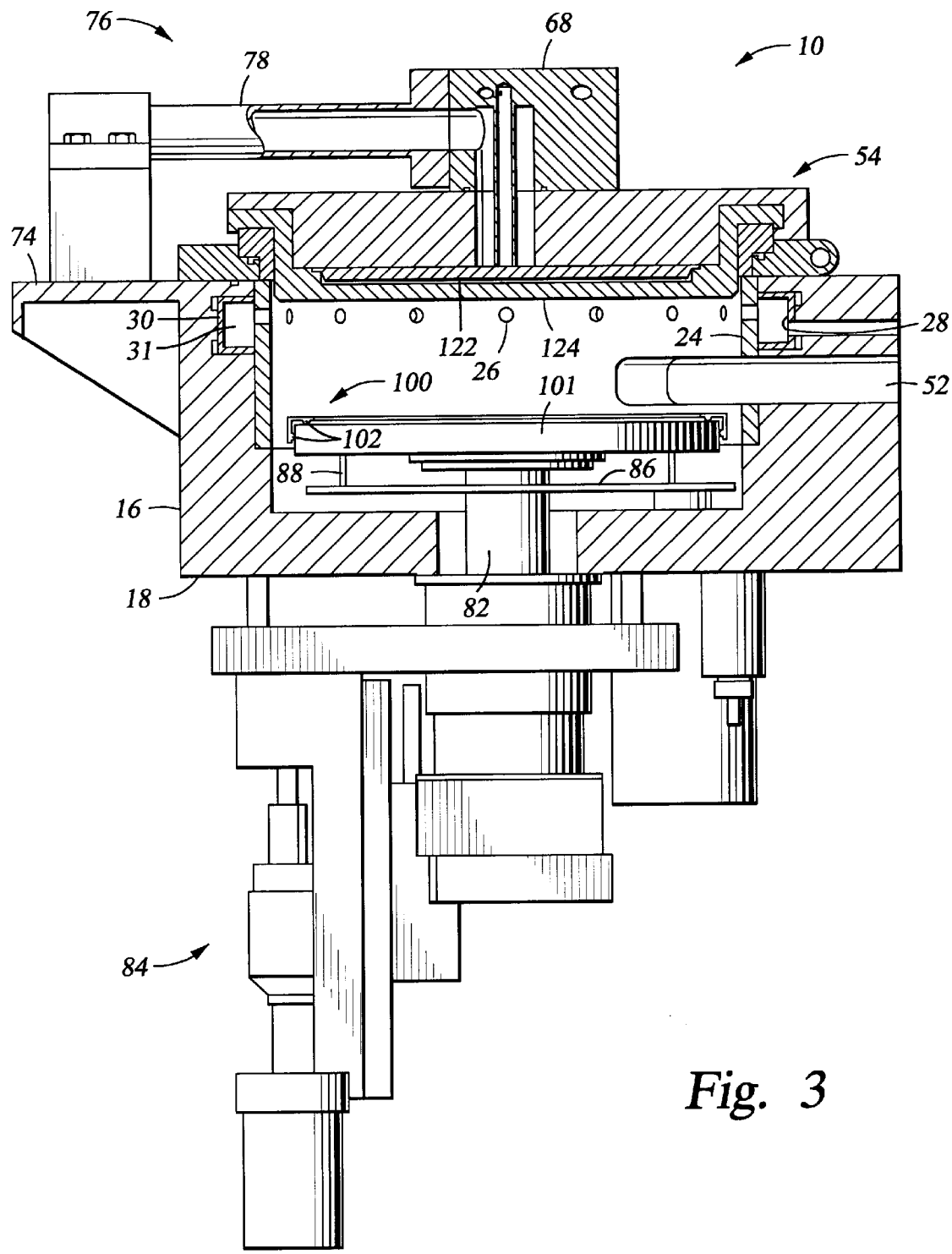
FIG. 3 is a cross sectional view of one embodiment of the present invention.

FIG. 3 is a cross sectional view of a chamber showing the chamber components in more detail. A substrate support member 101, typically referred to as a pedestal, is mounted on a stem 82 which is disposed through the bottom of the chamber. A lift assembly 84, such as a stepper motor and lead screw assembly, enables the substrate support member to be moved vertically within the chamber. A lift pin assembly 86, including three or more lift pins 88, a lift plate and an actuator to move the lift plate, is disposed in the lower portion of the chamber to raise and lower a substrate in the chamber from a robot blade onto the substrate support member and back. The lift mechanisms of both the substrate support member and lift pin assembly are well known in the art.

The pedestal 101 includes fluid channels formed therein to circulate a cooling/heating fluid therethrough. Preferably, a fluid such as deionized water, ethylene glycol or combinations thereof are circulated through the pedestal to provide a low temperature during processing. A temperature in the range of about 25° C. or less is preferred for some new materials. However, higher or lower temperatures could be provided by flowing a fluid at a select temperature to heat or cool the pedestal according to the needs of the process. The fluids are flown through the stem 82 connected to the pedestal from a remote chiller or heater. Commercial chillers or heaters can be used for this purpose.

An edge ring 100 is preferably mounted or otherwise supported on the pedestal 101. The edge ring 100 defines a processing area in which a substrate is disposed during processing. The edge ring is preferably made of ceramic materials or other dielectric materials and can be heated by the surrounding walls of the chamber body 16. Preferably, the edge ring is supported and spaced from the pedestal by spacers 102. For processes which require low pedestal (and/or substrate) temperatures, the edge ring with minimal contact area to the pedestal will achieve and maintain high temperature. Chamber cleaning efficiency can be improved by elevating the temperature of the edge ring.

Figure 4:
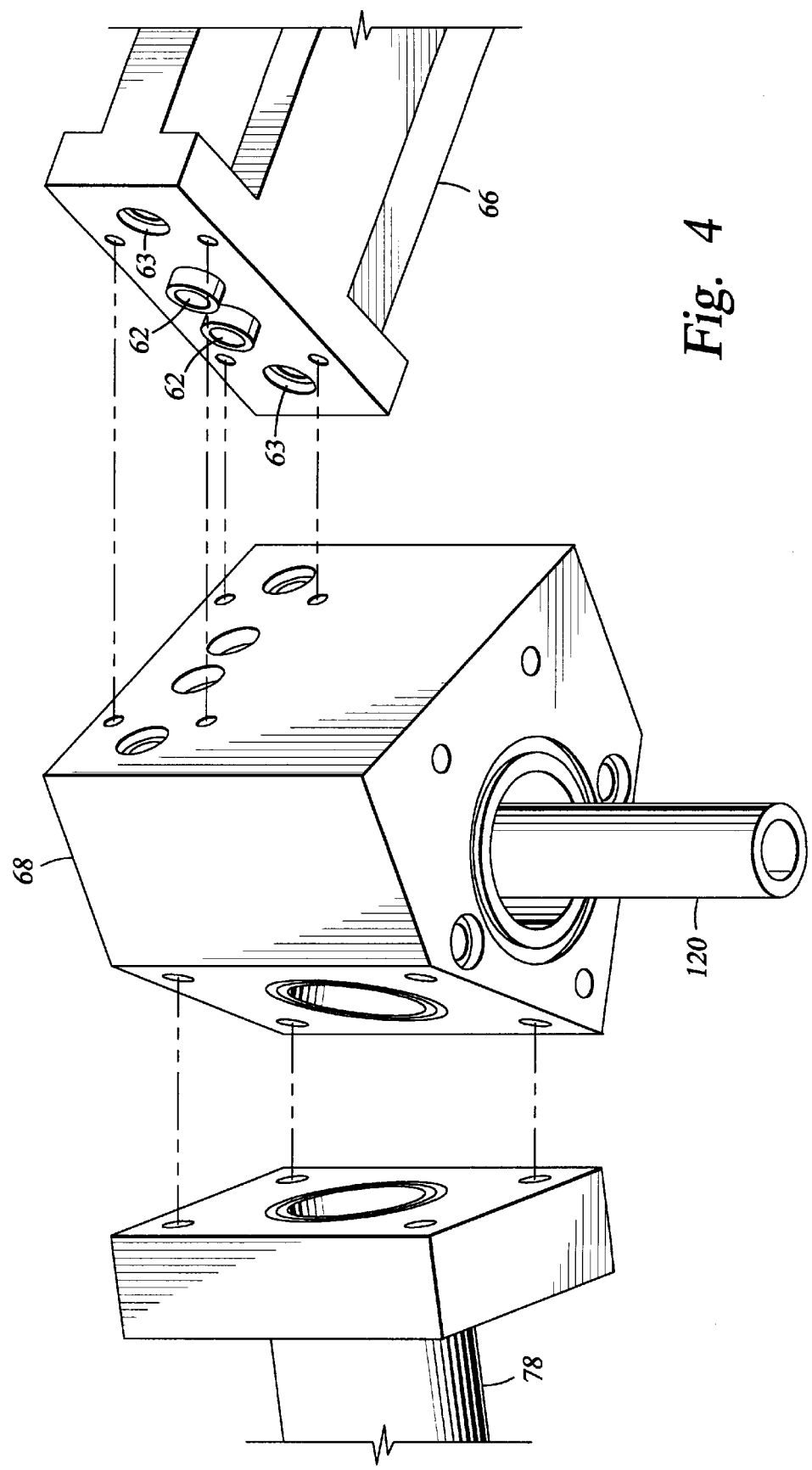
FIG. 4 is a perspective exploded view of a portion of a gas distribution assembly of the present invention.

FIG. 4 is an exploded perspective view of the gas outlet manifold 68 and the connections to the constant voltage gradient feedthrough 66 and the microwave applicator delivery tube 78. Gases are delivered from either the feedthrough 66, the delivery tube 78 or both into a gas inlet 120 of the outlet manifold 68. The gas inlet 120 delivers the gases to the upper surface of a blocker plate 122 (shown in FIG. 3). The blocker plate includes a plurality of holes (not shown) therethrough to evenly distribute the gases over a larger area than the gas inlet. A faceplate 124 is disposed below the blocker plate and defines a plurality of holes (not shown) therethrough which open into the chamber. The gases inlet into the gas distribution assembly are dispersed over the upper surface of the face plate after exiting the blocker plate and are then delivered into the chamber. A power source, preferably an RF power source is connected to the gas distribution assembly to enable generation of a plasma between the face plate and the upper surface of the substrate support member.

What is claimed is:

1. A processing apparatus, comprising:
   a) a chamber body defining a processing region, wherein the chamber body includes a nose portion;
   b) a removable gas feedthrough mounted on the chamber body;
   c) a chamber lid having a gas distribution assembly mounted thereon; and
   d) a microwave applicator mounted on the nose portion of the chamber body.

2. The apparatus of claim 1, further comprising a vacuum pump mounted on a side of the chamber body.

3. The apparatus of claim 1, further comprising a chamber liner disposed in the processing region.

4. The apparatus of claim 3, wherein the chamber body defines an annular channel.

5. The apparatus of claim 1, further comprising a pedestal disposed in the processing region.

6. The apparatus of claim 5, further comprising an edge ring selectively disposable on the pedestal.

7. The apparatus of claim 6, wherein the edge ring comprises one or more spacers disposed thereon.

8. The apparatus of claim 7, wherein the edge ring is made of a ceramic material.

9. A system for processing substrates, comprising:
   a) a transfer chamber;
   b) a loading station connected to the transfer station;
   c) one or more processing chambers connected to the transfer chamber, wherein the one or more processing chambers comprise:
      1) a chamber body defining a processing region, wherein the chamber body includes a nose portion;
      2) a removable gas feedthrough mounted on the chamber body;
      3) a chamber lid having a gas distribution assembly mounted thereon; and
      4) a microwave applicator mounted on the nose portion of the chamber body.

10. The system of claim 9, further comprising a vacuum pump mounted on a side of the chamber body.

11. The system of claim 9, further comprising a chamber liner disposed in the processing region.

12. The system of claim 11, wherein the chamber body defines an annular channel.

13. The system of claim 12, further comprising a Teflon liner disposed in the annular channel, wherein the Teflon liner and the chamber liner define an annular manifold.

14. The system of claim 9, further comprising a pedestal disposed in the processing region.

15. The system of claim 14, further comprising an edge ring selectively disposable on the pedestal.

16. The system of claim 15, wherein the edge ring comprises one or more spacers disposed thereon.

17. The system of claim 16, wherein the edge ring is made of a ceramic material.

18. The apparatus of claim 4, further comprising a Teflon liner disposed in the annular channel, wherein the Teflon liner and the chamber liner define an annular manifold.

* * * * *

UNITED STATES PATENT AND TRADEMARK OFFICE
CERTIFICATE OF CORRECTION

PATENT NO.   : 6,176,198 B1                                                Page 1 of 1
DATED        : January 23, 2001
INVENTOR(S)  : Yeh-Jen Kao et al.

It is certified that error appears in the above-identified patent and that said Letters Patent is hereby corrected as shown below:

<u>Title page,</u>
Item [56], References Cited, add to U.S. PATENT DOCUMENTS,
-- 3,854,443    12/1974      Baerg ... 118/49
5,525,160      6/1996       Tanaka ... 118/728 --
Please change "5,570,436     5/1998  Fong et al. ... 118/723 ME" to
-- 5,570,436   5/1998        Yamaga et al. ... 438/558 --.
Please change "Fonget" to -- Fong et --.
Please change "Koshiiishi" to -- Koshiishi --.
Add -- FOREIGN PATENT DOCUMENTS
EP     0863536        9/1998 ... H01J/37/32
DE     19654737A1     3/1997 ... H01L/21/31 --
OTHER PUBLICATIONS:
Please change: "U.S. application Entitled "Low Power Method of Depositing A Low K. Dielectric with Organo Silane, filed, 1998, Ser. No. 09/114,682" to -- U.S. application Entitled "Low Power Method of Depositing A Low K. Dielectric with Organo Silane, filed, July 13, 1998, Ser. No. 09/114,682. --
Please add: -- PCT International Search Report for PCT/US99/25631 dated Mar. 2, 2000 --

Signed and Sealed this

Twelfth Day of November, 2002

*Attest:*

*Attesting Officer*

JAMES E. ROGAN
*Director of the United States Patent and Trademark Office*